United States Patent
Aoki (10) Patent No.: US 8,018,297 B2
(45) Date of Patent: Sep. 13, 2011

(54) BALANCED-UNBALANCED CONVERSION CIRCUIT

(75) Inventor: Kazuharu Aoki, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 263 days.

(21) Appl. No.: 12/492,504

(22) Filed: Jun. 26, 2009

(65) Prior Publication Data

US 2010/0007430 A1   Jan. 14, 2010

(30) Foreign Application Priority Data

Jul. 14, 2008   (JP) .................................. 2008-182565

(51) Int. Cl.
*H03H 7/42* (2006.01)
*H01P 5/00* (2006.01)
(52) U.S. Cl. .............................................. 333/25; 333/4
(58) Field of Classification Search ................... 333/25, 333/26, 4, 177
See application file for complete search history.

(56) References Cited

U.S. PATENT DOCUMENTS
7,683,733 B2 * 3/2010 Li et al. ............................ 333/25

FOREIGN PATENT DOCUMENTS
JP    2004-274715       9/2004
JP    2006020063 A  *  1/2006

* cited by examiner

*Primary Examiner* — Dean O Takaoka
(74) *Attorney, Agent, or Firm* — Brinks Hofer Gilson & Lione (57) ABSTRACT

A balanced-unbalanced conversion circuit includes a first coupling line, an unbalanced terminal connected to the first coupling line, a ground terminal connected to the unbalanced terminal through the first coupling line, a second coupling line electromagnetically coupled to the first coupling line, a first balanced terminal connected to the second coupling line, a second balanced terminal connected to the first balanced terminal through the second coupling line, and a band-reject filter serially connected to the first coupling line to remove predetermined-band signals of high frequency signals transmitted through the first coupling line.

6 Claims, 9 Drawing Sheets

BALANCED-UNBALANCED CONVERSION CIRCUIT

CROSS REFERENCE TO RELATED APPLICATIONS

The present application contains subject matter related to and claims priority to Japanese Patent Application No. 2008-182565 filed in the Japanese Patent Office on Jul. 14, 2008, the entire contents of which is incorporated herein by reference.

BACKGROUND

1. Technical Field

The present invention relates to a balanced-unbalanced conversion circuit having a filtering function of attenuating interference waves, in addition to a balanced-unbalanced conversion function.

2. Related Art

Balanced-unbalanced conversion circuits (Balun) have been used for connection between an unbalanced type device and a balanced type device and between devices having different impedance. Recently, a circuit provided with a trap circuit has been proposed to prevent interference waves from being transmitted to a rear end circuit in various electronic apparatuses such as communication apparatuses.

Figure 9:
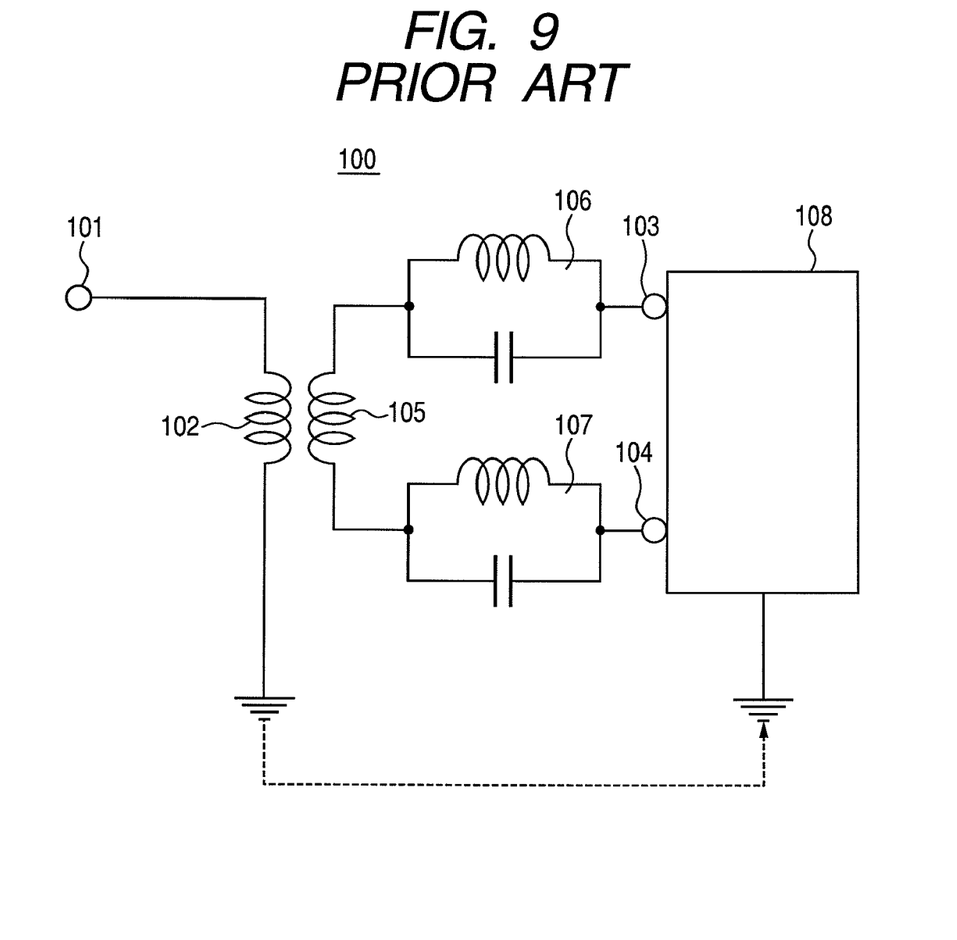
FIG. 9 is a schematic circuit diagram illustrating the known balun.

FIG. 9 is a schematic circuit diagram illustrating the known balun. As shown in FIG. 9, the balun 100 mainly includes an unbalanced terminal 101, a first coupling line 102 connected between the unbalanced terminal 101 and a reference potential (ground), two balanced terminals 103 and 104, and a second coupling line 105 connected between the balanced terminals 103 and 104 and coupled to the first coupling line 102. A trap circuit includes an LC parallel resonant circuit 106 connected between one end of the second coupling line 105 and one balanced terminal 103, and an LC parallel resonant circuit 107 connected between the other end of the second coupling line 105 and the other balanced terminal 104. The LC parallel resonant circuits 106 and 107 establish attenuation poles in a frequency band adjacent to a pass band.

According to the balun 100 with such a configuration, an unbalanced signal input from the unbalanced terminal 101 is converted into a balanced signal between the first coupling line 102 and the second coupling line 105, and the converted signal is output from the balanced terminals 103 and 104. In this case, interference waves are removed by the trap circuit (106, 107) having the attenuation poles in a frequency band of the interference waves, so as to prevent the interference waves from being transmitted to a rear end circuit 108.

As shown with a dotted line in FIG. 9, the interference waves included in the signal transmitted from the second coupling line 105 to the balanced terminals 103 and 104 are removed by the trap circuit (106, 107), but the interference waves from the ground terminal of the first coupling line 102 cannot be prevented from being input to the rear end circuit 108 through the ground. Particularly, at high frequency, it is difficult to make a ground having invariable potential, and thus it is important to provide for the prevention of the interference waves transmitted through the ground.

SUMMARY

According to an aspect of the disclosure, a balanced-unbalanced conversion circuit includes: a first coupling line; an unbalanced terminal connected to the first coupling line; a ground terminal connected to the unbalanced terminal through the first coupling line; a second coupling line electromagnetically coupled to the first coupling line; a first balanced terminal connected to the second coupling line; a second balanced terminal connected to the first balanced terminal through the second coupling line; and a band-reject filter serially connected to the first coupling line to remove predetermined-band signals of high frequency signals transmitted through the first coupling line.

With such a configuration, the band-reject filter for removing the predetermined-band signals of the high frequency signals transmitted through the first coupling line is serially connected to the first coupling line. Accordingly, the interference waves in the band removed by the band-reject filter are not transmitted to the ground and are attenuated, and thus it is possible to prevent the interference wave from being input from the ground terminal of the first coupling line to the rear end circuit through the ground.

DESCRIPTION OF EXEMPLARY EMBODIMENTS

Hereinafter, an embodiment of the disclosure will be described in detail with reference to the accompanying drawings.

Figure 1:
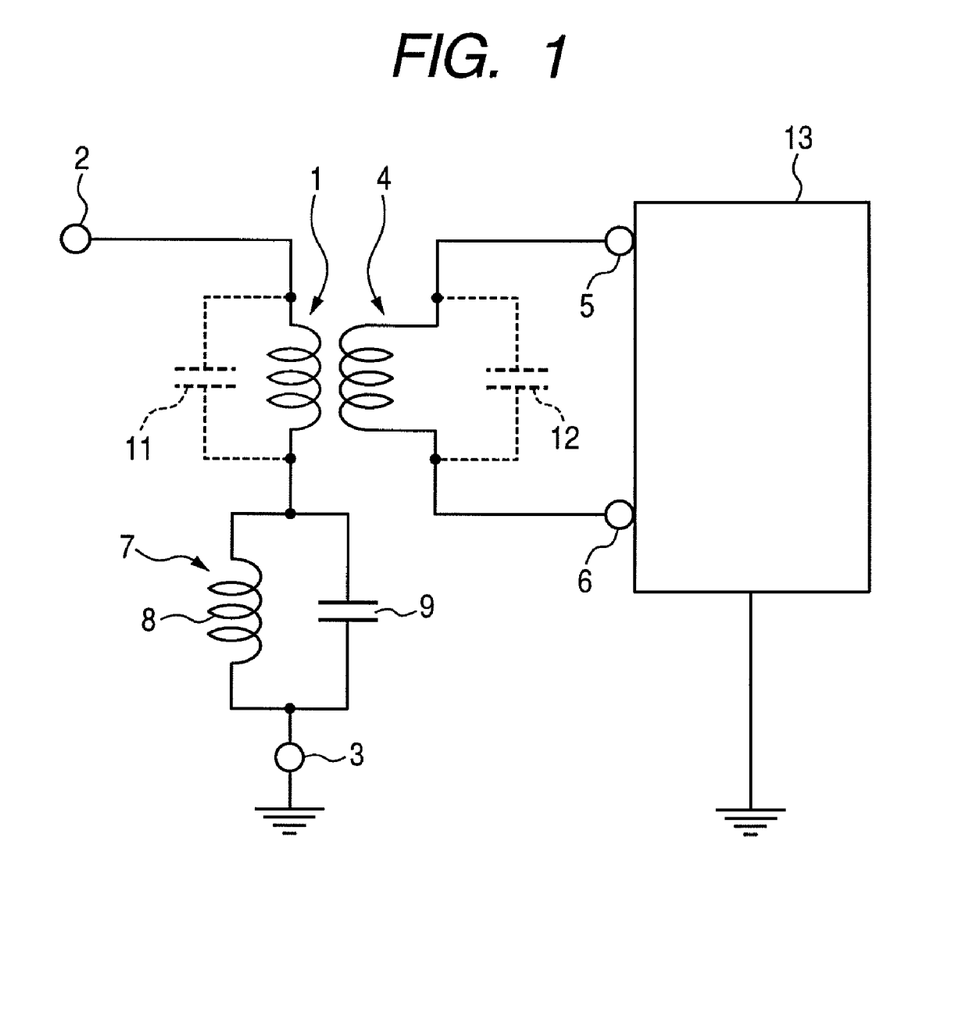
FIG. 1 is a schematic diagram illustrating a balanced-unbalanced conversion circuit according to an embodiment of the invention.

FIG. 1 is a schematic diagram illustrating a balanced-unbalanced conversion circuit according to an embodiment of the disclosure. In the balanced-unbalanced conversion circuit according to the embodiment, one end of a first coupling line 1 is connected to an unbalanced terminal 2, and the other end is connected to a ground terminal 3. A second coupling line 4 is electromagnetically coupled to the first coupling line 1, one end of the second coupling line 4 is connected to a first balanced terminal 5, and the other end is connected to a second balanced terminal 6.

In the embodiment, a band-reject filter 7 is serially connected to the first coupling line 1. The band-reject filter 7 is formed by an LC parallel resonant circuit including an inductor 8 and a capacitor 9. The removal band (resonant frequency) of the band-reject filter 7 can be positioned as desired according to use or according to the ambient communication band being used and noise environment. In this specification, signals within the removal band are referred to as interference waves.

A first capacitor 11 is connected parallel to the first coupling line 1, an inductance component of the first coupling line 1 and the first capacitor constitute a band-pass filter, and a pass band thereof is set to coincide with the frequency of the signal allowed to pass. On the balanced side as well as the unbalanced side, a second capacitor 12 is connected parallel to the second coupling line 4, an inductance component of the second coupling line 4 and the second capacitor 12 constitute a band-pass filter, and a pass band thereof is set to coincide with the frequency of the signal allowed to pass.

In the balanced-unbalanced conversion circuit with such a configuration, signals outside the pass band are attenuated by the band-pass filter formed by the first coupling line 1 and the first capacitor 11, and the band-reject filter 7 resonates at a frequency of interference waves. Accordingly, the signals within the pass band are efficiently transmitted to the second coupling line 4 electromagnetically connected to the first coupling line 1, by the band-pass filter formed by the first coupling line 1 and the first capacitor 11, and thus the signals outside the pass band are attenuated. The second coupling line 4 electromagnetically coupled to the first coupling line 1, together with the second capacitor 12, constitute the band-pass filter, and the signals within the pass band are efficiently transmitted to the first and second balanced terminals 5 and 6 with small loss and are input to a rear end circuit 13.

In this case, the signals outside the pass band are attenuated in the band-pass filter formed by the first coupling line 1 and the first capacitor 11, but signals adjacent to the pass band are additionally removed by the band-pass filter 7. In the band-pass filter 7, the parallel resonant circuit resonates at the same frequency as that of the interference waves, impedance becomes infinite with respect to the interference waves, and the interference waves are prevented from flowing into the ground. Accordingly, the signals within the pass band of the high frequency signals input to the unbalanced terminal 2 are efficiently transmitted to the balanced side circuit, and the interference waves do not flow into the ground and are removed. Therefore, it is possible to prevent the interference waves from being input to the rear end circuit 13 through the ground.

As described above, according to the embodiment, the band-reject filter 7 is provided between the first coupling line 1 and the ground terminal 3, and thus the interference waves are prevented from being transmitted to the ground. Accordingly, it is possible to prevent the interference waves from being transmitted to the rear end circuit 13 through the ground.

In addition, the band-pass filter is formed by the first coupling line 1 and the first capacitor 11, and the band-pass filter is formed by the second coupling line 4 and the second capacitor 12, and the band-pass filters resonate at the frequency of the pass band. Accordingly, it is possible to shorten the length of the coupling lines to ¼ wavelength, and thus it is possible to reduce the size of the circuit. Moreover, it is not necessary to provide a separate band-pass filter, and thus it is possible to add a filtering function without a large increase in the number of components.

In the embodiment, the band-reject filter 7 is connected between the first coupling line 1 and the ground terminal 3, but the band-reject filter may be connected between the unbalanced terminal 2 and the first coupling line 1. On the hot side of the first coupling line 1, the interference waves are removed by the band-reject filter, and it is possible to prevent the interference waves from being transmitted to the rear end circuit through the ground.

Example 1

Figure 2:
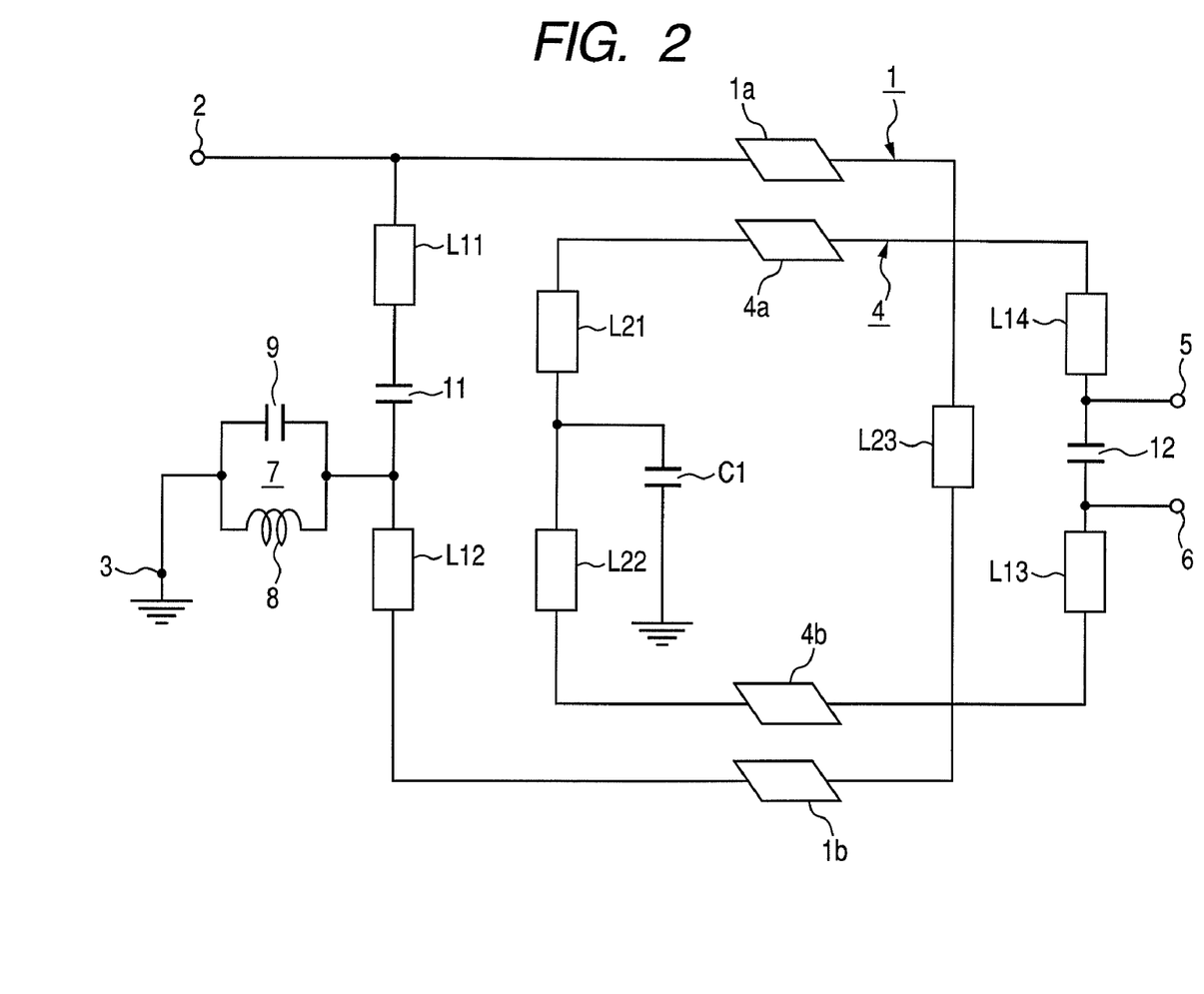
FIG. 2 is a circuit diagram illustrating a balanced-unbalanced conversion circuit according to Example 1.

FIG. 2 is a circuit diagram illustrating a balanced-unbalanced conversion circuit according to Example 1.

The balanced-unbalanced conversion circuit according to Example 1 is provided on a multilayer board, and the first coupling line 1 and the second coupling line 4 are formed by a wiring pattern of different conductive layers. Inductors 1a and 1b on the unbalanced side as a coupling area and inductors 4a and 4b on the balanced side are respectively opposed to each other, with a dielectric substance therebetween, and they are electromagnetically coupled to each other. As shown in FIG. 2, L11, L12, L13, L14, L21, L22, and L23 indicate inductance components formed by the winding of the first and second coupling lines 1 and 4 on the multilayer board.

One end of the first coupling line 1 is connected to the unbalanced terminal 2, the other end is connected to the ground terminal 3, and the capacitor 11 is connected parallel to the inductors 1a and 1b. The LC parallel resonant circuit 7 is connected between the ground side terminal of the capacitor 11 and the ground terminal 3. That is, the LC parallel resonant circuit 7 is provided on the ground side, and is formed by a parallel circuit including the inductor 8 and the capacitor 9. In capacitors provided on the multilayer board, capacitance components named as stray capacity are generated among all grounds on the multilayer board. As described in Example 1, the stray capacity is formed parallel to the capacitor 9 by forming the LC parallel resonant circuit 7 on the ground side. Accordingly, the circuit is designed in consideration of the stray capacity, thereby preventing deterioration of characteristics.

One end of the second coupling line 4 is connected to one balanced terminal 5, the other end is connected to the other balanced terminal 6, and the capacitor 12 is connected parallel to the inductors 4a and 4b. In the second coupling line 4, a middle point between L21 and L22 is connected to the ground through a bypass capacitor C1, and DC voltage is applied to the middle point.

Example 2

Figure 3:
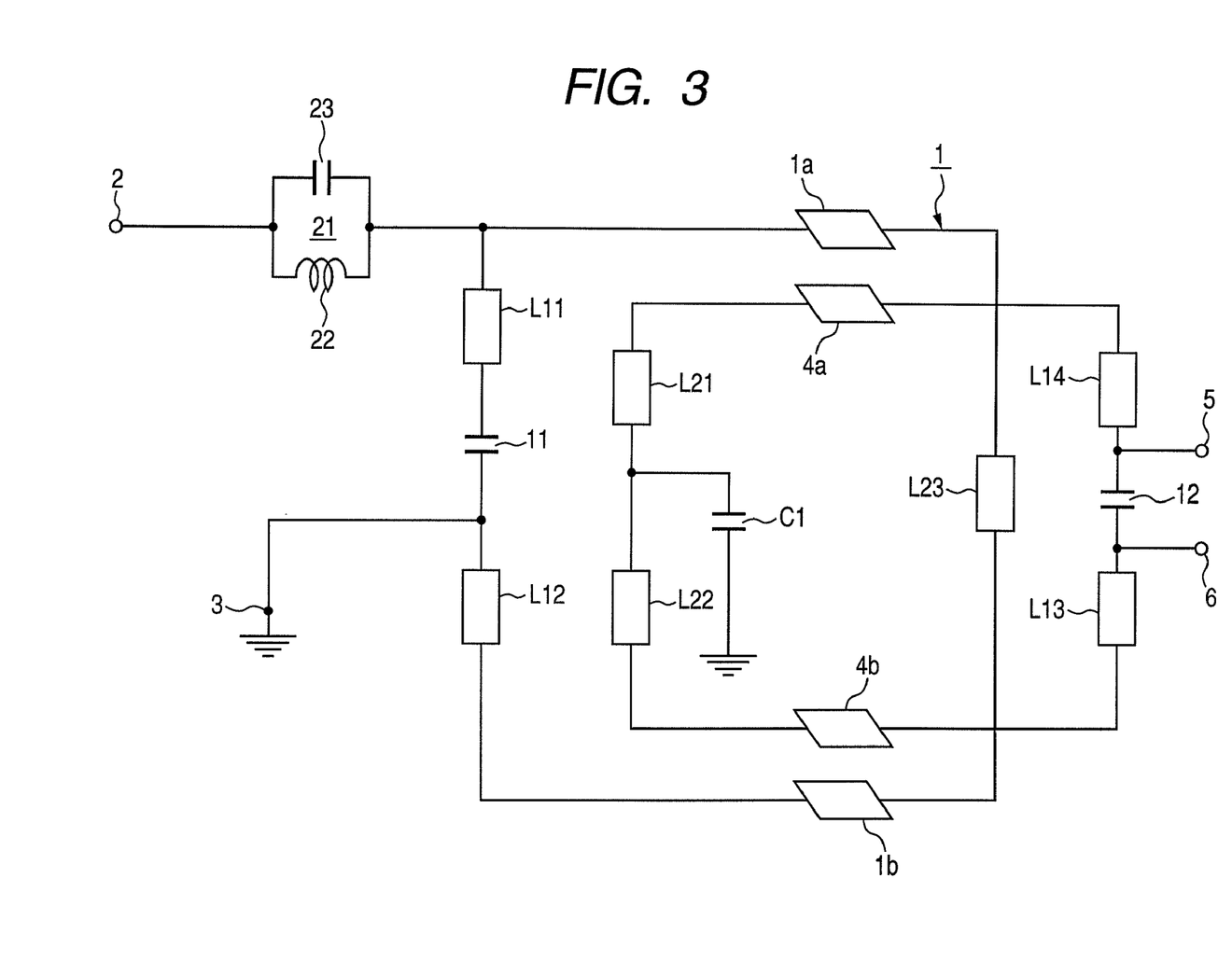
FIG. 3 is a circuit diagram illustrating a balanced-unbalanced conversion circuit according to Example 2.

FIG. 3 is a circuit diagram illustrating a balanced-unbalanced conversion circuit according to Example 2.

In the balanced-unbalanced conversion circuit according to Example 2, an LC parallel resonant circuit 21 is connected as a band-reject filter between the unbalanced terminal 2 and the first coupling line 1. The LC parallel resonant circuit 21 is formed by a parallel circuit including an inductor 22 and a capacitor 23. The other configuration is the same as that of Example 1.

In Example 2, the LC parallel resonant circuit 21 is provided on the hot side, and thus the circuit configuration is changed by stray capacity formed between the capacitor 23 and the ground. Accordingly, some deterioration in characteristics is expected.

Next, a simulation result of frequency selection characteristics based on the balanced-unbalanced conversion circuits of Example 1 and Example 2 will be described.

To make value Q of the LC parallel resonant circuit 7 in Example 1 and the LC parallel resonant circuit 21 in Example 2 equal, in the LC parallel resonant circuit 7, capacitance was set to 4.05 pF and inductance was set to 0.85 nH. In the LC parallel resonant circuit 21, capacitance was set to 4.13 pF (1.02 times the capacitance of Example 1) and inductance was set to 0.833 nH (1/1.02 times the inductance of Example 1).

Figure 4:
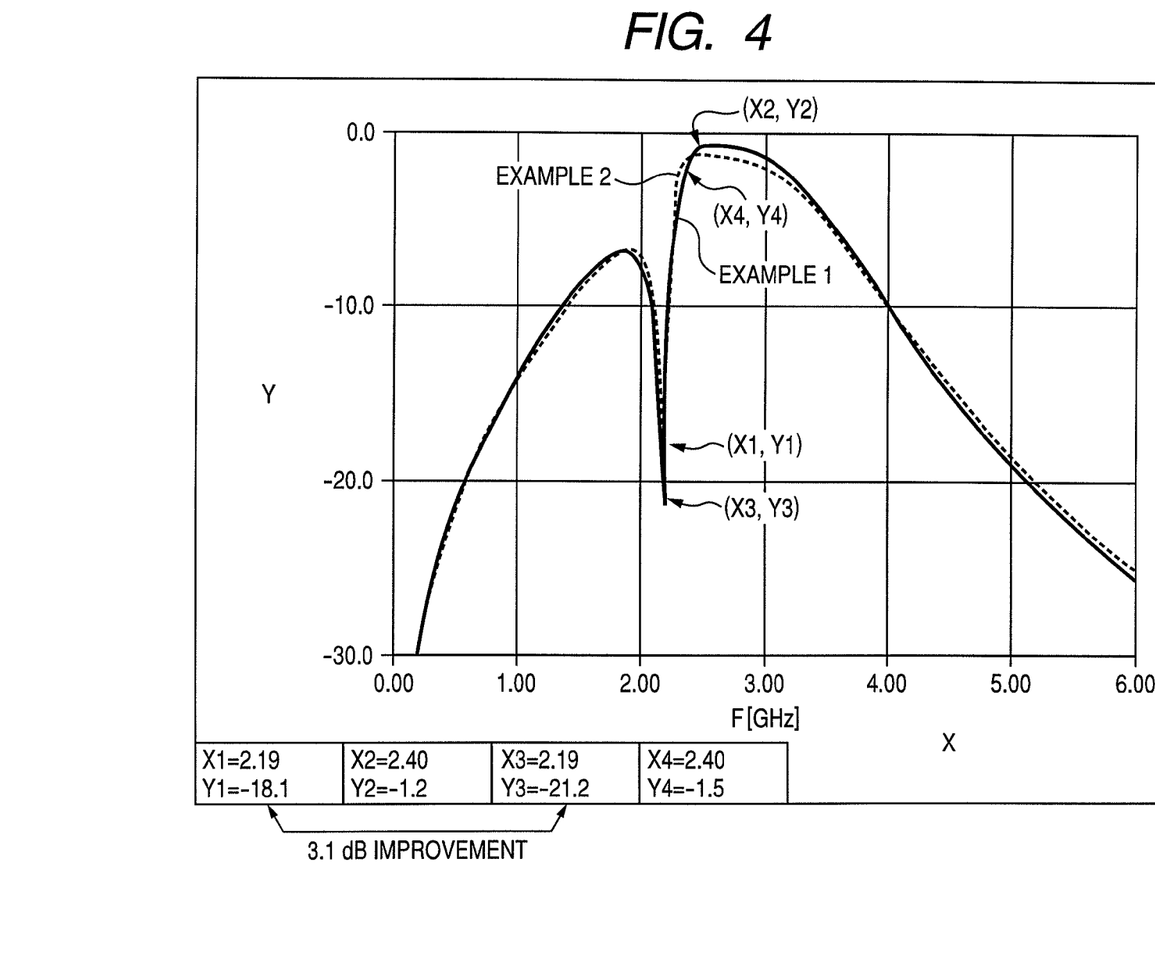
FIG. 4 is a diagram illustrating a simulation result of frequency selection characteristics of Example 1 and Example 2.

FIG. 4 is a diagram illustrating a simulation result of frequency selection characteristics of Example 1 and Example 2.

In Example 1 and Example 2, each pass band is 2.4 GHz, and attenuation poles are formed at adjacent 2.19 GHz in the frequency selection characteristics. Comparing Example 1 with Example 2, it can be seen that attenuation at 2.19 GHz in Example 1, which provides the LC parallel circuit 7 on the cold side, is improved by 3.1 dB, as compared with attenuation in Example 2, which provides the LC parallel circuit 21 on the hot side. The reason is thought to be because the circuit configuration deviates from the designed values by the stray capacity, since the LC parallel resonant circuit 21 is provided on the hot side in Example 2.

Example 3

Figure 5:
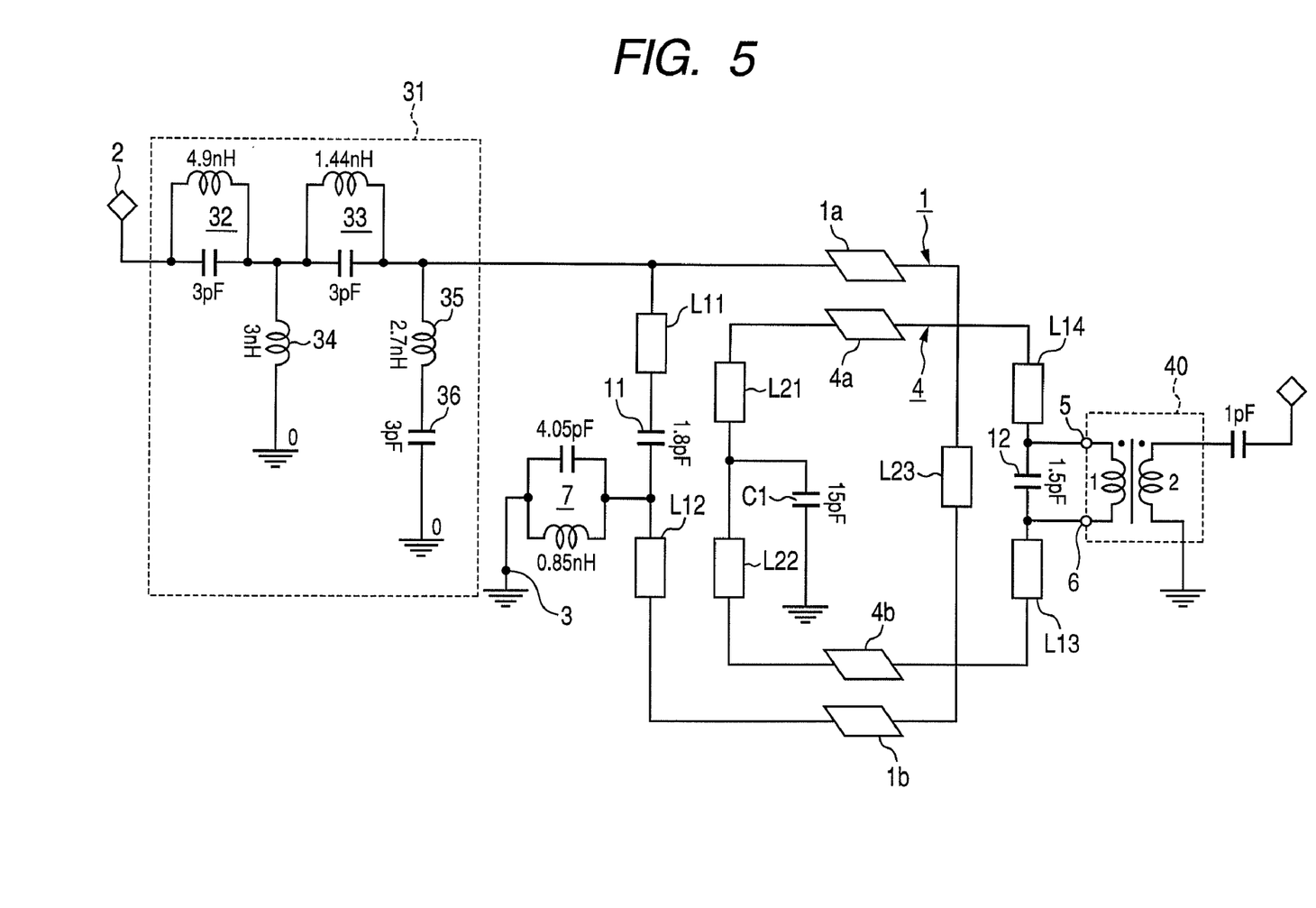
FIG. 5 is a circuit diagram illustrating a balanced-unbalanced conversion circuit according to Example 3.

FIG. 5 is a circuit diagram illustrating a balanced-unbalanced conversion circuit according to Example 3.

The balanced-unbalanced conversion circuit according to Example 3 is provided with the LC parallel resonant circuit 7 on the cold side as in the case of Example 1, and is provided with a high-pass filter 31 between the unbalanced terminal 2 and the first coupling line 1.

In the high-pass filter 31, a middle connection point between two LC parallel resonant circuits 32 and 33 is connected to the ground through an inductor 34. An end portion of the high-pass filter 31 close to the first coupling line is connected to the ground through an LC serial resonant circuit including an inductor 35 and a capacitor 36.

In wireless communication such as WLAN and WMAX, a band of 2.4 to 3 GHz is used. On the other hand, since there are bands (2.1 GHz, 1.9 GHz, etc.) used in other wireless communication methods such as W-CDMA, it is necessary to form a notch filter or a precipitous trap for reliably attenuating the band. For example, there is a demand for attenuating a band close to 2.17 GHz.

The balanced-unbalanced conversion circuit according to Example 3 is designed with frequency selection characteristics to form the high-pass filter 31 in which the pass band is 2.4 GHz or higher, and to form attenuation poles at 2.17 GHz and 1.9 GHz.

A rear end circuit 40 is connected to the balanced terminals 5 and 6 for simulation.

Example 4

Figure 6:
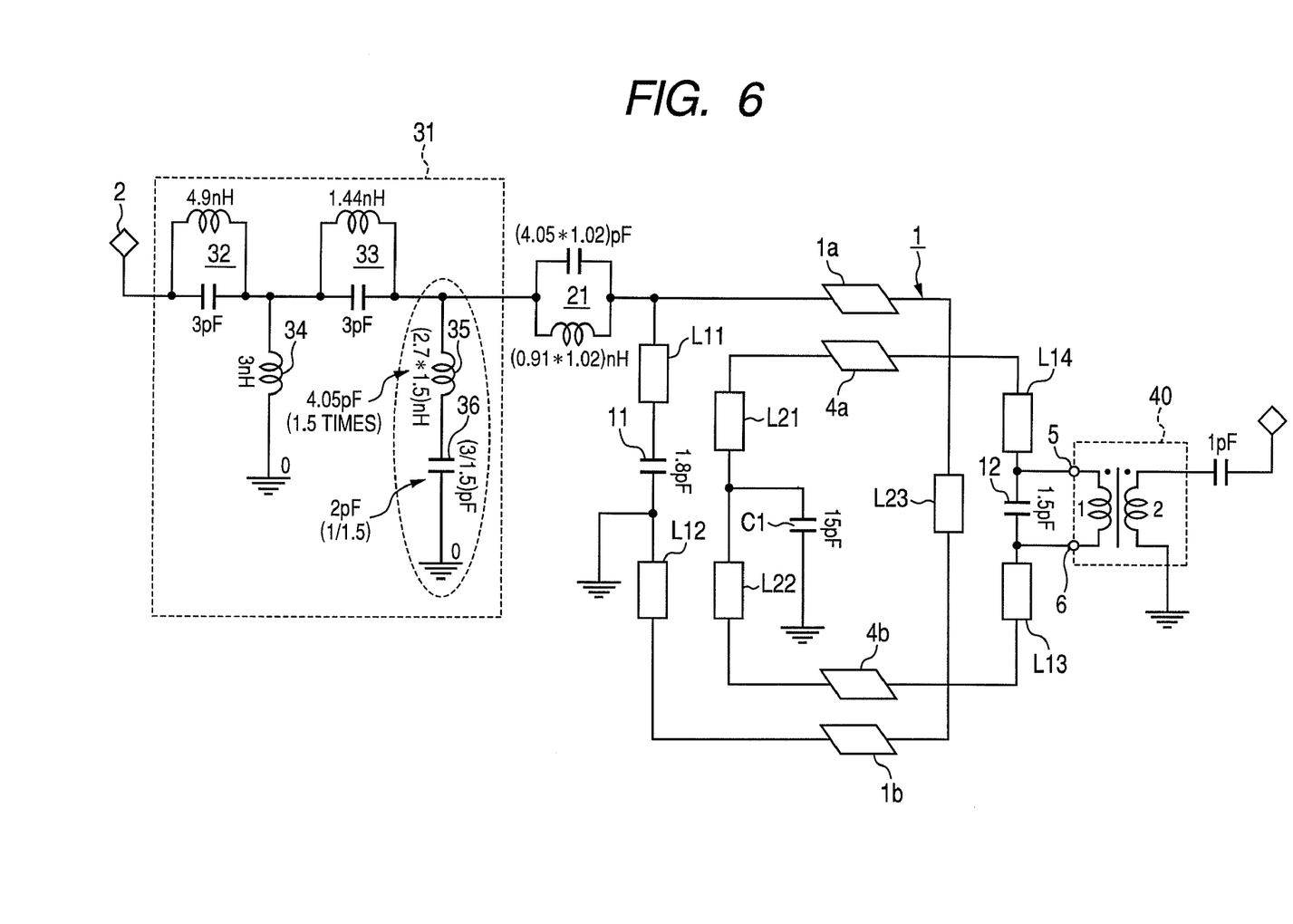
FIG. 6 is a circuit diagram illustrating a balanced-unbalanced conversion circuit according to Example 4.

FIG. 6 is a circuit diagram illustrating a balanced-unbalanced conversion circuit according to Example 4.

The balanced-unbalanced conversion circuit according to Example 4 is provided with the LC parallel resonant circuit 21 on the hot side as in the case of Example 2, and is provided with the high-pass filter 31 between the unbalanced terminal 2 and the first coupling line 1. The frequency selection characteristics of the high-pass filter 31 are basically the same as those of Example 3.

Next, a simulation result of frequency selection characteristics based on the balanced-unbalanced conversion circuits of Example 3 and Example 4 will be described.

Figure 7:
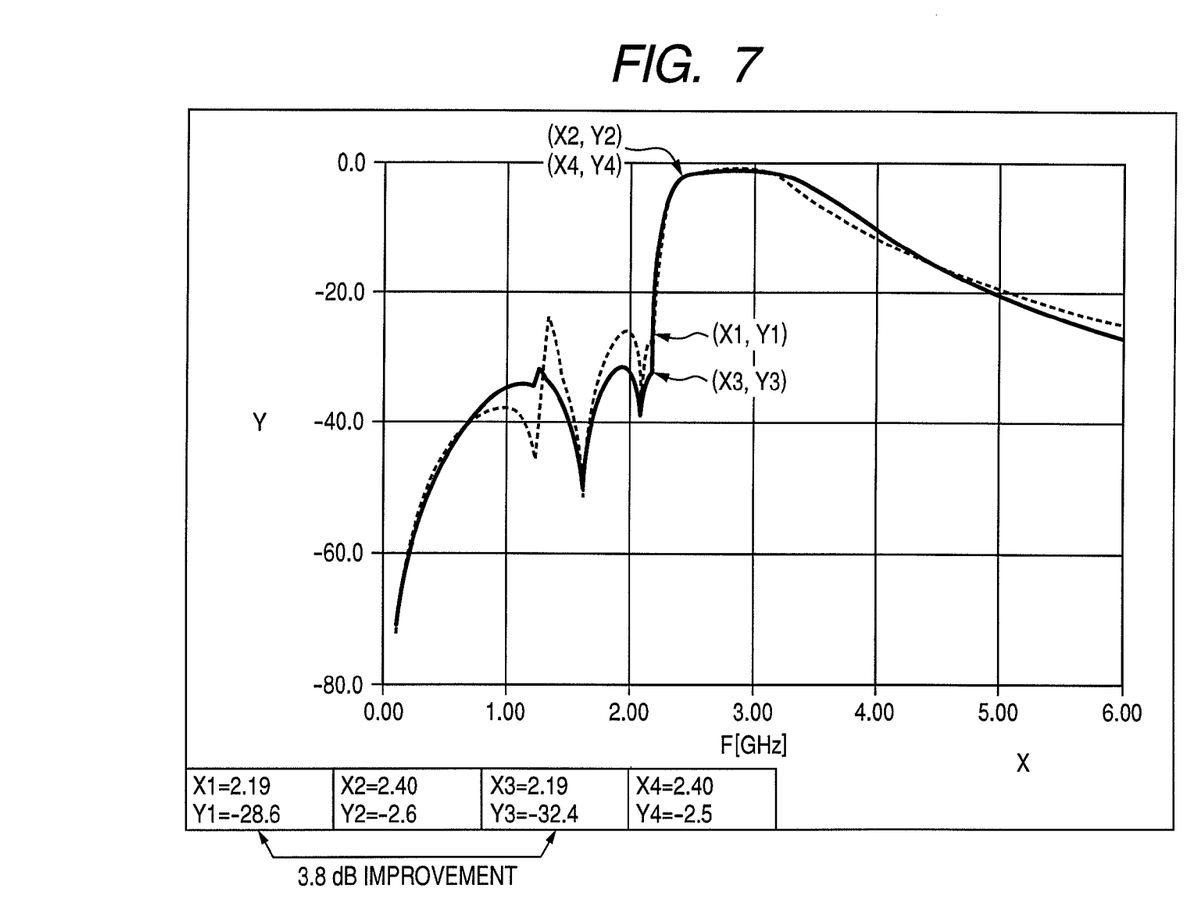
FIG. 7 is a diagram illustrating a simulation result of frequency selection characteristics of Example 3 and Example 4.
Figure 8:
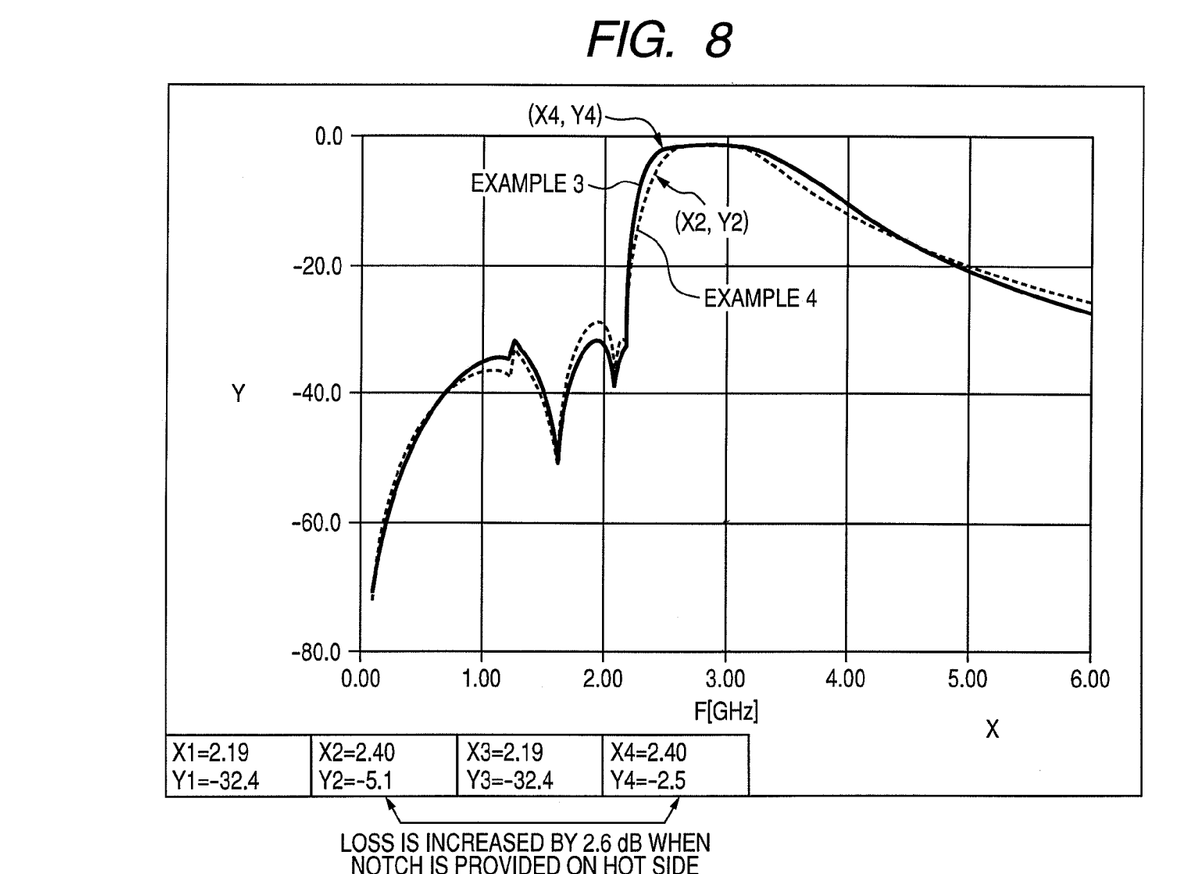
FIG. 8 is a diagram illustrating a simulation result of frequency selection characteristics of Example 3 and Example 4.

FIG. 7 and FIG. 8 are diagrams illustrating the simulation results of frequency selection characteristics of Example 3 and Example 4.

In the simulation shown in FIG. 7, to make value Q of the LC parallel resonant circuit 7 in Example 3 and the LC parallel resonant circuit 21 in Example 4 equal, in the LC parallel resonant circuit 7, capacitance was set to 4.05 pF and inductance was set to 0.85 nH. In the LC parallel resonant circuit 21, capacitance was set to 4.13 pF (1.02 times) and inductance was set to 0.833 nH (1/1.02 times). In addition, the inductor 35 of the high-pass filter 31 in the balanced-unbalanced conversion circuit according to Example 3 was set to 2.7 nH, and the capacitor 36 thereof was set to 3 pF. The inductor 35 of the high-pass filter 31 in the balanced-unbalanced conversion circuit according to Example 4 was set to 4.05 nH (1.5 times the inductance of Example 3), and the capacitor 36 thereof was set to 2 pF (1/1.5 times the capacitance of Example 3).

As shown in FIG. 7, a frequency of 2.19 GHz close to the pass band of 2.4 GHz was precipitously attenuated in all cases of Example 3 and Example 4. However, the attenuation of Example 3 provided with the LC parallel resonant circuit 7 on the cold side is larger by 3.8 dB than that of Example 4 provided with the LC parallel resonant circuit 21 on the hot side. Attenuation poles are formed at 1.6 GHz by the LC serial resonant circuit including the inductor 35 and the capacitor 36.

In the simulation shown in FIG. 8, the LC parallel resonant circuit 7 in Example 3 and the LC parallel resonant circuit 21 in Example 4 are formed in the same setting as that of Example 3. The inductor 35 of the high-pass filter 31 in the balanced-unbalanced conversion circuits according to Example 3 and Example 4 is set to 2.7 nH, and the capacitor thereof is set to 3 pF.

As shown in FIG. 8, attenuation in the pass band of 2.4 GHz in Example 3 is −2.5 dB. On the contrary, attenuation of the pass band of 2.4 GHz in Example 4 is −5.1 dB. That is, it can be seen that loss of the pass band in Example 4 is larger by 2.6 dB than that of Example 3.

The invention is not limited to the embodiment. For example, as necessary, the attenuation poles may be formed closer to the high frequency band than the pass band.

What is claimed is:

1. A balanced-unbalanced conversion circuit comprising:
    a first coupling line;
    an unbalanced terminal connected to the first coupling line;
    a ground terminal connected to the unbalanced terminal through the first coupling line;
    a second coupling line electromagnetically coupled to the first coupling line;
    a first balanced terminal connected to the second coupling line;
    a second balanced terminal connected to the first balanced terminal through the second coupling line; and
    a band-reject filter serially connected to the first coupling line to remove predetermined-band signals of high frequency signals transmitted through the first coupling line.

2. The balanced-unbalanced conversion circuit according to claim 1, wherein the band-reject filter is provided between the first coupling line and the ground terminal.

3. The balanced-unbalanced conversion circuit according to claim 1, wherein the band-reject filter is a parallel resonant circuit including an inductor and a capacitor connected parallel to each other.

4. The balanced-unbalanced conversion circuit according to claim 1, further comprising:
    a first capacitor provided parallel to the coupled part of the first coupling line; and
    a second capacitor provided parallel to the coupled part of the second coupling line,
    wherein the first coupling line and the first capacitor resonate parallel to each other in a pass band, and the second coupling line and the second capacitor resonate parallel to each other in the pass band.

5. The balanced-unbalanced conversion circuit according to claim 4, wherein a high-pass filter allowing signals over the pass band to pass is provided between the unbalanced terminal and the first coupling line, and the band-reject filter has attenuation poles in a predetermined frequency lower than that of the pass band.

6. The balanced-unbalanced conversion circuit according to claim 3, wherein the inductor and the capacitor of the band-reject filter, and the first and second coupling lines are formed by a wiring pattern in a multilayer board.

* * * * *